(12) United States Patent
How et al.

(10) Patent No.: US 9,123,626 B1
(45) Date of Patent: Sep. 1, 2015

(54) INTEGRATED PASSIVE FLIP CHIP PACKAGE

(71) Applicant: Texas Instruments Incorporated, Dallas, TX (US)

(72) Inventors: You Chye How, Melaka (MY); Siew Kee Lee, Kedah (MY); Huay Yann Tay, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 31 days.

(21) Appl. No.: 14/192,402

(22) Filed: Feb. 27, 2014

(51) Int. Cl.
*H01L 23/48* (2006.01)
*H01L 29/40* (2006.01)
*H01L 21/00* (2006.01)
*H01L 25/16* (2006.01)
*H01L 23/495* (2006.01)
*H01L 23/528* (2006.01)
*H01L 23/00* (2006.01)
*H01L 23/31* (2006.01)
*H01L 23/532* (2006.01)
*H01L 21/768* (2006.01)
*H01L 21/56* (2006.01)
*H01L 25/00* (2006.01)

(52) U.S. Cl.
CPC ............ *H01L 25/165* (2013.01); *H01L 21/565* (2013.01); *H01L 21/768* (2013.01); *H01L 21/76898* (2013.01); *H01L 23/3107* (2013.01); *H01L 23/481* (2013.01); *H01L 23/49503* (2013.01); *H01L 23/49541* (2013.01); *H01L 23/49575* (2013.01); *H01L 23/528* (2013.01); *H01L 23/53214* (2013.01); *H01L 23/53228* (2013.01); *H01L 24/09* (2013.01); *H01L 24/17* (2013.01); *H01L 24/81* (2013.01); *H01L 25/50* (2013.01); *H01L 2224/0401* (2013.01); *H01L 2224/05025* (2013.01); *H01L 2224/16113* (2013.01); *H01L 2224/16245* (2013.01); *H01L 2224/81801* (2013.01); *H01L 2924/01013* (2013.01); *H01L 2924/01022* (2013.01); *H01L 2924/01029* (2013.01); *H01L 2924/01072* (2013.01); *H01L 2924/01073* (2013.01); *H01L 2924/01074* (2013.01); *H01L 2924/04941* (2013.01); *H01L 2924/0534* (2013.01); *H01L 2924/05042* (2013.01); *H01L 2924/05432* (2013.01); *H01L 2924/05442* (2013.01); *H01L 2924/1205* (2013.01); *H01L 2924/1206* (2013.01); *H01L 2924/1207* (2013.01); *H01L 2924/14* (2013.01)

(58) Field of Classification Search
CPC ..................... H01L 23/481; H01L 21/76898
USPC .......................................... 257/778; 428/108
See application file for complete search history.

(56) References Cited

U.S. PATENT DOCUMENTS

| | | | |
|---|---|---|---|
| 6,546,620 B1 | 4/2003 | Juskey et al. | |
| 7,615,407 B1 | 11/2009 | Poddar et al. | |
| 8,026,129 B2 | 9/2011 | Cablao et al. | |
| 8,563,432 B2 | 10/2013 | Hong | |
| 2005/0046041 A1 | 3/2005 | Tsai | |
| 2009/0079066 A1 | 3/2009 | Jang | |
| 2010/0133704 A1* | 6/2010 | Marimuthu et al. | 257/778 |
| 2011/0254160 A1* | 10/2011 | Tsai et al. | 257/738 |
| 2014/0227832 A1* | 8/2014 | Wang et al. | 438/124 |

* cited by examiner

*Primary Examiner* — Long K Tran
(74) *Attorney, Agent, or Firm* — Steven A. Shaw; Frank D. Cimino

(57) ABSTRACT

A method for packaging integrated circuit die such that each package includes die with integrated passive components mounted to either the back surface, the active surface or both the back and active surfaces of the die.

16 Claims, 5 Drawing Sheets

INTEGRATED PASSIVE FLIP CHIP PACKAGE

FIELD OF THE INVENTION

The present invention relates generally to the packaging of integrated circuits (ICs). More particularly, methods and systems are described for producing IC packages that include integrated passive components.

BACKGROUND OF THE INVENTION

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections. In general, the die and portions of the leadframe are encapsulated with a molding material to protect the delicate electrical components on the active side of the die while leaving selected portions of the leadframe exposed to facilitate electrical connection to external devices.

The resultant IC packages are often mounted onto printed circuit boards (PCBs). The PCB is used to mechanically support and electrically connect electronic components including the IC package using conductive pathways, or traces, typically etched from copper sheets laminated onto a non-conductive substrate. In many applications, it is desirable to position various non-active (or passive) components along some of the traces to interrupt certain signal transmission paths between the die and an external device or power supply. By way of example, one or more of resistors, capacitors and/or inductors are often mounted onto the PCB. A bypass capacitor, for instance, is often used to decouple one part of the circuit from another. More specifically, a bypass capacitor may be used to bypass the power supply or other high impedance component of the circuit.

Building passive components of integrated circuits during wafer fabrication has limitations on performance due to the need for higher inductance, capacitance or resistance.

Direct contact of passive components on leads of conventional wire bond packages provide similar function as integrated passive components; however, there are disadvantages to this approach. These disadvantages include, but are not limited to, a larger foot print of the packaged devices in order to include the passive components on the leads, higher package cost due to the requirement of both passive attach, usually with a solder reflow process and additional wire bonds and finally longer electrical signal paths between integrated circuit die and the passive components which impacts energy loss.

With the evolution of mobile devices to become smaller in size, smaller foot prints of packaged devices is required.

As such, there has arisen a need for an improved packaging of the combination of integrated circuits and passive components.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, a packaged integrated circuit device is provided. The packaged integrated circuit device, comprising: a lead frame, having a plurality of leads; an integrated circuit die having an active surface and a back surface; the active surface of the integrated circuit die includes a first set of bond pads, multiple metallization layers that overlie active circuits formed within the semiconductor substrate of the die, intermediate dielectric layers interposed between the metallization layers to physically and electrically separate the metallization layers, electrically conductive vias formed in the dielectric layers at appropriate locations in order to electrically connect specific portions of the metallization layers in desired locations; at least one pair of through silicon via (TSV)s, the TSVs having a first end and a second end, wherein the first end of the each TSV is coupled to the metal interconnection patterns of the active surface of the integrated circuit die and the second end of the TSV is coplanar with the back surface of the integrated circuit die. Each TSV has solderable under bump metalizations UBM on each end of the TSV; at least one surface mount passive device; wherein the at least one surface mount passive device is mounted on the top or bottom of the integrated circuit die and coupled to the at least one pair of TSVs; the first set of bond pads of the plurality of bond pads are coupled to leads of the lead frame by solder balls; and molding compound encapsulating the assembly, wherein the molding compound protects the assembly from the outside environment while exposing the leads of the leadframe to the outside world for coupling into a more complex electrical system.

In accordance with another embodiment of the present application, a method of packaging integrated circuit devices is provided. The method of packaging integrated circuit devices, comprising: providing a lead frame, having a plurality of leads; providing an integrated circuit wafer, the wafer including a multiplicity of integrated circuit dice, each die having an active surface and a back surface, the active surface of each die including a first set of bond pads and a second set of bond pads, the back surfaces of the dice combining to form the back surface of the wafer; forming multiple metallization layers that overlie active circuits formed within the semiconductor substrate of the die; forming intermediate dielectric layers interposed between the metallization layers to physically and electrically separate the metallization layers; forming electrically conductive vias in the dielectric layers at appropriate locations in order to electrically connect specific portions of the metallization layers in desired locations; forming at least one pair of through silicon via (TSV)s, the TSVs having a first end and a second end, wherein the first end of the each TSV is coupled to the metal interconnection patterns of the active surface of the integrated circuit die and the second end of the TSV is coplanar with the back surface of the integrated circuit die; forming solderable under bump metalizations UBM on each end of the TSV; providing at least one surface mount passive device; mounting the at least one surface mount passive device on the top or bottom of the integrated circuit die and coupling it to the at least one pair of TSVs; coupling the first set of bond pads to each of the plurality of leads of the lead frame using solder balls; and encapsulating the assembly with molding compound, wherein the molding compound protects the assembly from the outside environment while exposing the leads of the leadframe to the outside world for coupling into a more complex electrical system.

DESCRIPTION OF THE VIEWS OF THE DRAWING

The following detailed description will be more readily understood in conjunction with the accompanying drawings, in which.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present invention relates generally to the packaging of integrated circuits (ICs). More particularly, methods and systems are described for producing IC packages that include integrated passive components.

Figure 1:
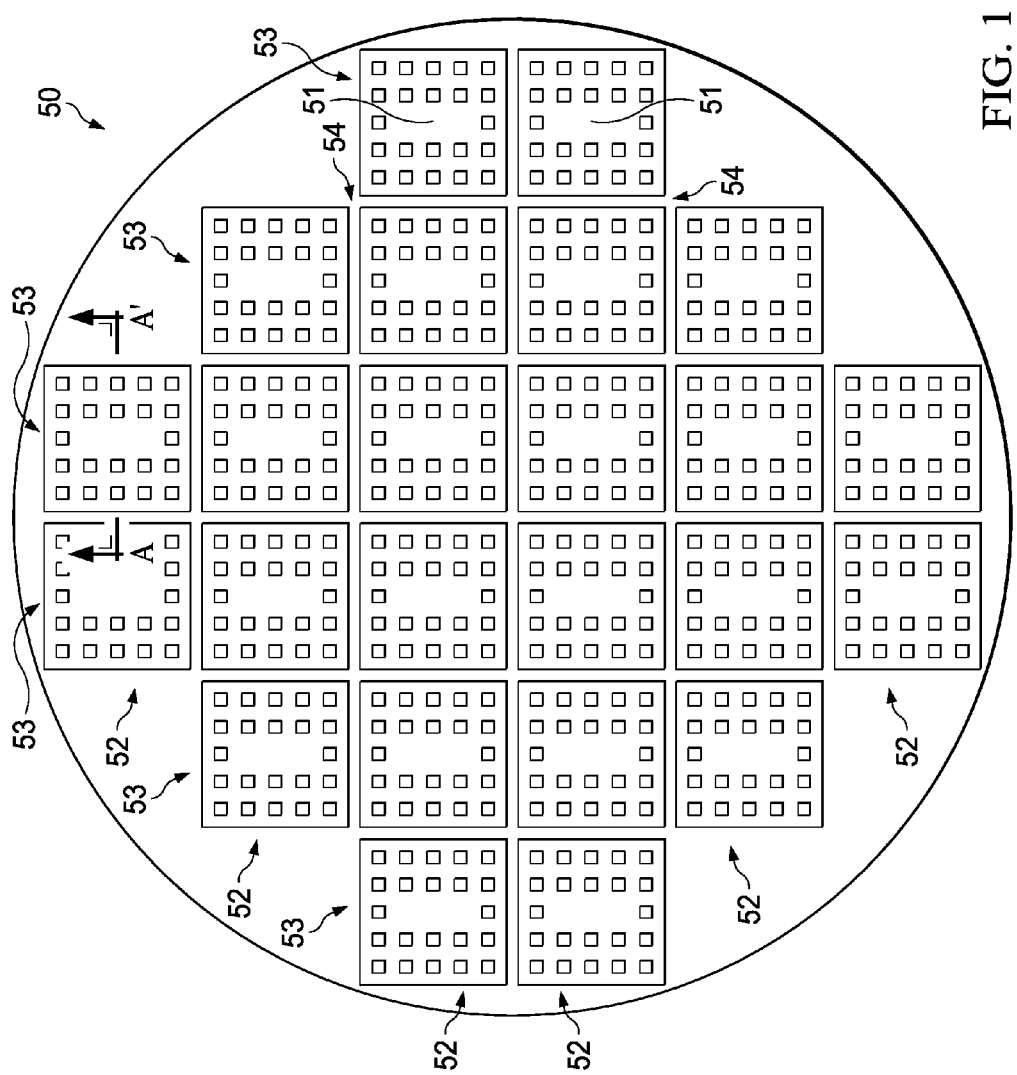
FIG. 1 is a top view of an exemplary wafer detailing rows, columns, scribe line and integrated circuit die, according to one embodiment of this invention.

FIG. 1 shows an example of a semiconductor wafer 50 that includes a large number of dice 51. As is well known in the art, most wafers and dice are formed of silicon (Si), although any other appropriate semiconductor material can also be used. It will be appreciated by those familiar with the art that state of the art wafers will typically have several hundred to several thousand dice formed therein and it is expected that even higher device densities can be attained in future wafers. The die are generally formed into a two-dimensional array of rows 52 and columns 53 with each row/column being separated from immediately adjacent rows/columns by scribe lines 54 (also known as saw streets). Each die will become an IC component after it is singulated from the wafer. Each die has an active surface including metal interconnection patterns a plurality of bond pads and a back surface.

Figure 2:
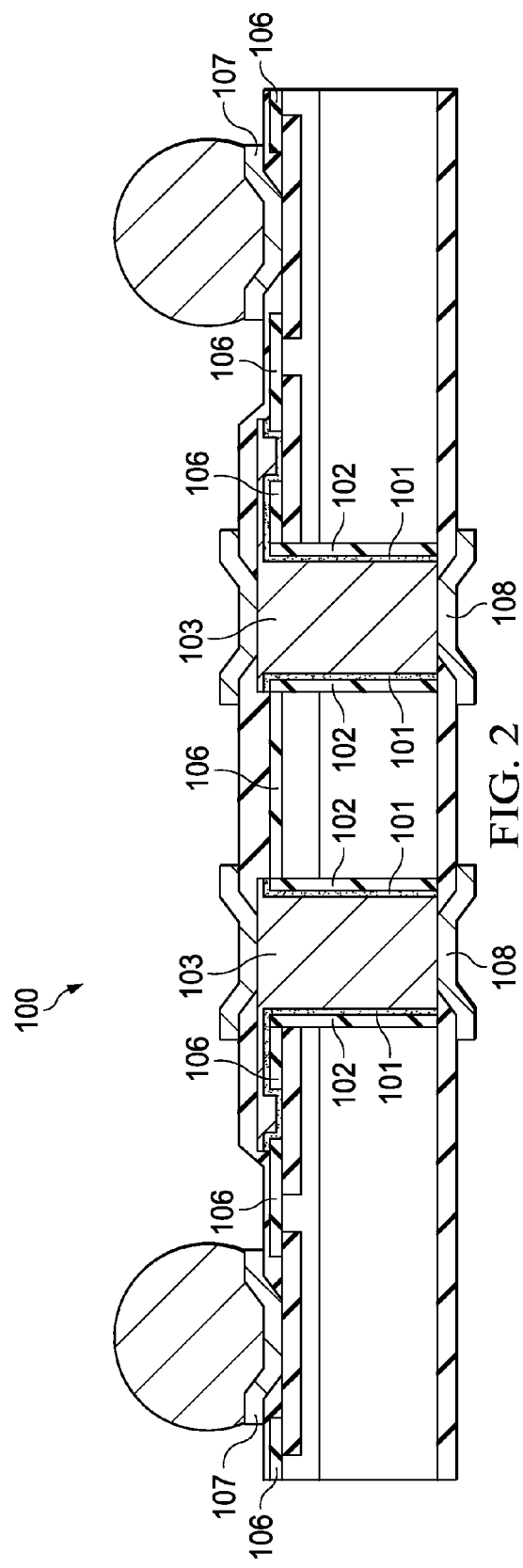
FIG. 2 is a cross sectional view of an exemplary integrated circuit die at section A:A' of FIG. 1 detailing a surface mount integrated, according to one embodiment of this invention.

FIG. 2 is a cross sectional view of an embodiment of an example flip chip integrated circuit 100. Integrated circuit 100 includes at least a pair of Through Silicon Via (TSV)s 103, the TSVs each having a first end and a second end, wherein the first end of the each TSV is coupled to the metal interconnection patterns of the active surface of the die and the second end of the TSV is coplanar with the back surface of the die. Each TSV has solderable metalizations UBM 108 on each end of the TSV. The integrated circuit 100 active surface generally has multiple metallization layers that overlie active circuits formed within the semiconductor substrate of the die. Intermediate dielectric layers 106 are typically interposed between the metallization layers to physically and electrically separate the metallization layers. Electrically conductive vias are formed in the dielectric layers at appropriate locations in order to electrically connect specific portions of the metallization layers in desired locations.

The various metallization layers may be used as ground/power planes and/or as signal routing interconnects within the IC die. A variety of materials may be used to form the dielectric and metallization layers. By way of example, aluminum (AL) and copper (Cu) are often used materials for the metallization layers and (in Si based devices) silicon dioxide, silicon nitride and/or other oxides and nitrides are commonly used to form the dielectric layers. Selected portions of the topmost metallization layer are left exposed through various openings in the outermost dielectric or passivation layer on the active surface of each die to form a plurality of bond pads 107 (hereinafter also referred to as "I/O pads") that serve as electrical contacts for the die, wherein under bump metalization (UBM) 107 covers the exposed plurality of bond pads thus providing a solderable surface.

Figure 3:
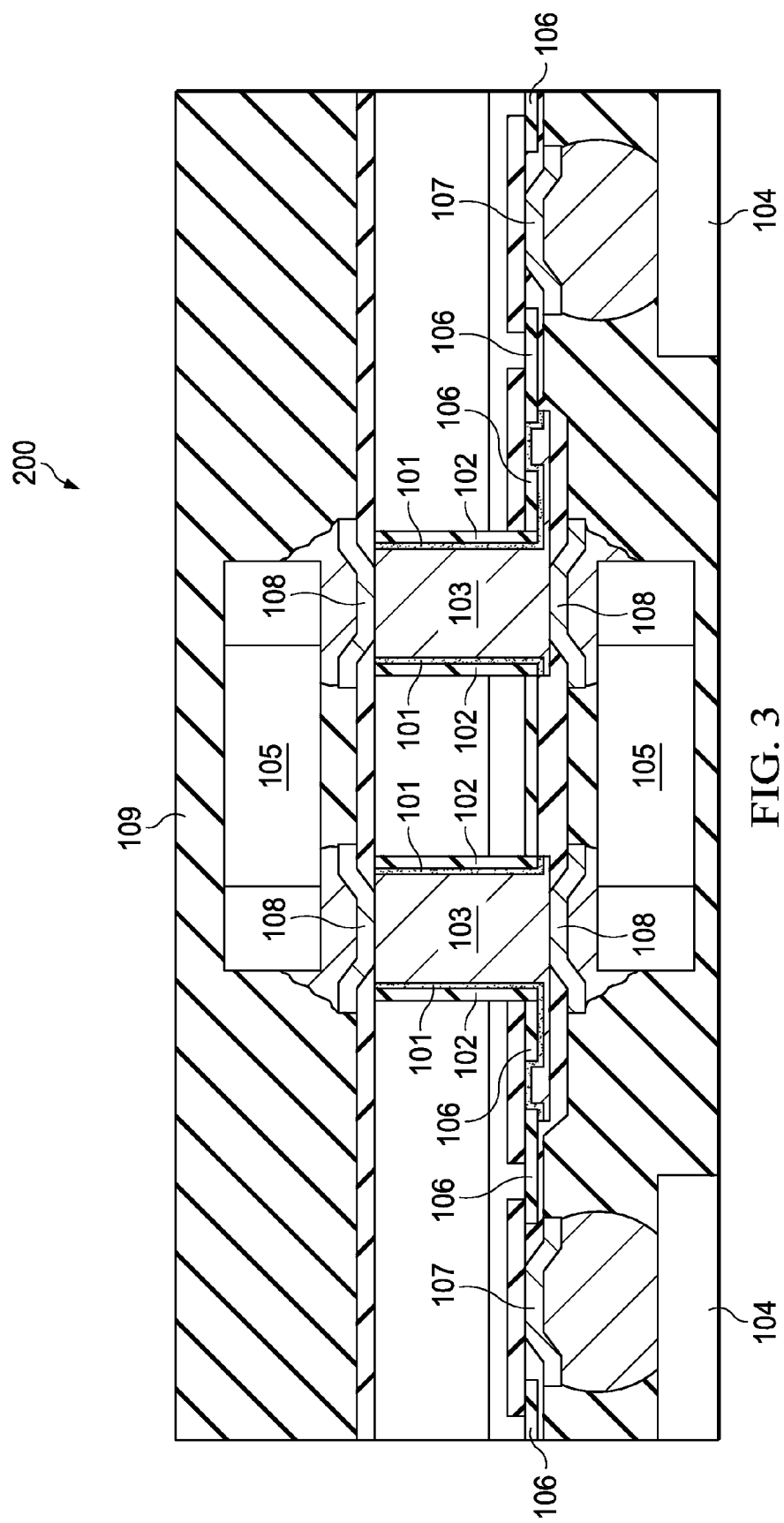
FIG. 3 is a cross sectional view of an exemplary package detailing a flip chip mounted integrated circuit with surface mount passive devices mounted to both the top and bottom of the integrated circuit die, according to one embodiment of this invention.

FIG. 3 is a cross sectional view of an embodiment of an example flip chip integrated circuit 100 coupled to a lead frame 104 with passive surface mount devices 105 mounted to both sides of the integrated circuit in a package 200 including an integrated circuit with at least a pair of through silicon via (TSV)s 103, the TSVs having a first end, a second end and sidewalls, where in the first end of the each TSV is coupled to the metal interconnection patterns of the active surface of the integrated circuit die and the second end of the TSV is coplanar with the back surface of the integrated circuit die. Each TSV has solderable metalizations UBM 108 on each end of the TSV. A surface mount passive device 105 is mounted on the bottom of the integrated circuit die and coupled to the at least a pair of TSVs 103 and another surface mount passive device 105 is mounted on the top of the integrated circuit and also coupled to the at least a pair of TSVs 103.

TSVs 103 are formed by etching a via through a die, depositing an insulator layer 102 such as silicon dioxide, silicon nitride, oxide-nitride-oxide, hafnium oxide or aluminum oxide on the walls of the via. Next an adhesion layer 101 is deposited on the insulator layer 102 such as tantalum-tantalum nitride of titanium-titanium nitride. Subsequently the via cavity is filled with a conductive material, such as tungsten or copper. And lastly a solderable metalization 108 UBM is provided on the top and bottom ends of the via.

The integrated circuit and its passive components are then assembled by soldering the passive components to the integrated circuit and soldering the integrated circuit in flip chip fashion to the lead frame 104. The assembly is then encapsulated in molding compound 109 to protect the assembly from the outside environment while exposing the leads of the leadframe to the outside world for coupling into a more In the illustrated embodiment FIG. 3, each die includes at least a pair of through silicon via (TSV)s 103, wherein each of the TSVs 103 has a solderable metalization UBM 108 coupled to each end. Each of the plurality of bond pads 107 are coupled to leads of the lead frame by solder balls.

Figure 4:
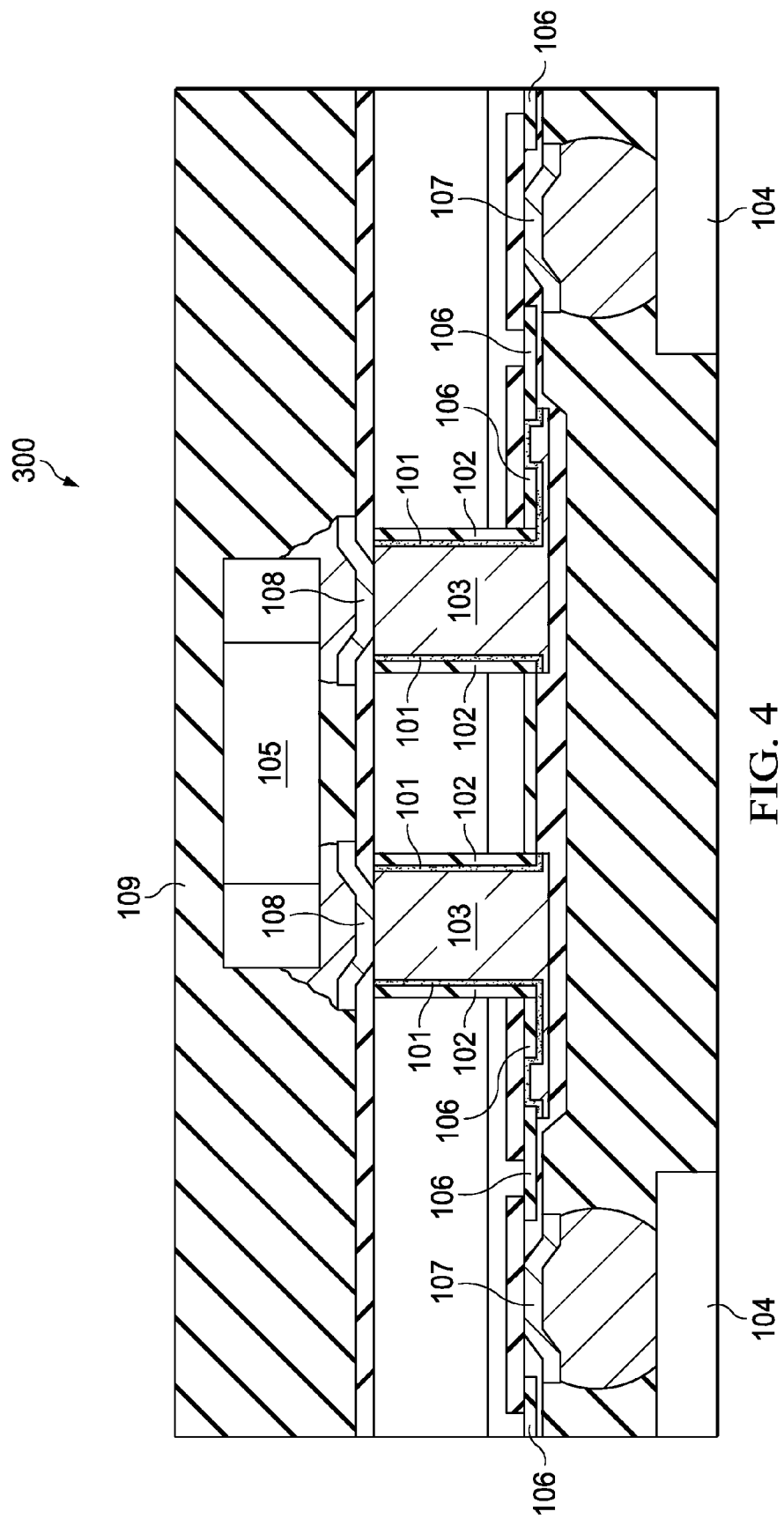
FIG. 4 is a cross sectional view of an exemplary package detailing a flip chip mounted integrated circuit with a surface mount passive device mounted to the bottom of the integrated circuit die, according to one embodiment of this invention.

FIG. 4 is a cross sectional view another embodiment of an example flip chip integrated circuit 100 coupled to a lead frame 104 with passive surface mount devices 105 mounted to the bottom of the integrated circuit in a package 300 including an integrated circuit with at least a pair of through silicon via (TSV)s 103, a surface mount passive device 105 mounted on the bottom of the integrated circuit and coupled to at least a pair of TSVs 103.

The integrated circuit and its passive component is then assembled by soldering the passive component to the integrated circuit and soldering the integrated circuit in flip chip fashion to the lead frame 104. The assembly is then encapsulated in molding compound 109 to protect the assembly from the outside environment while exposing the leads of the leadframe to the outside world for coupling into a more complex electrical system.

Figure 5:
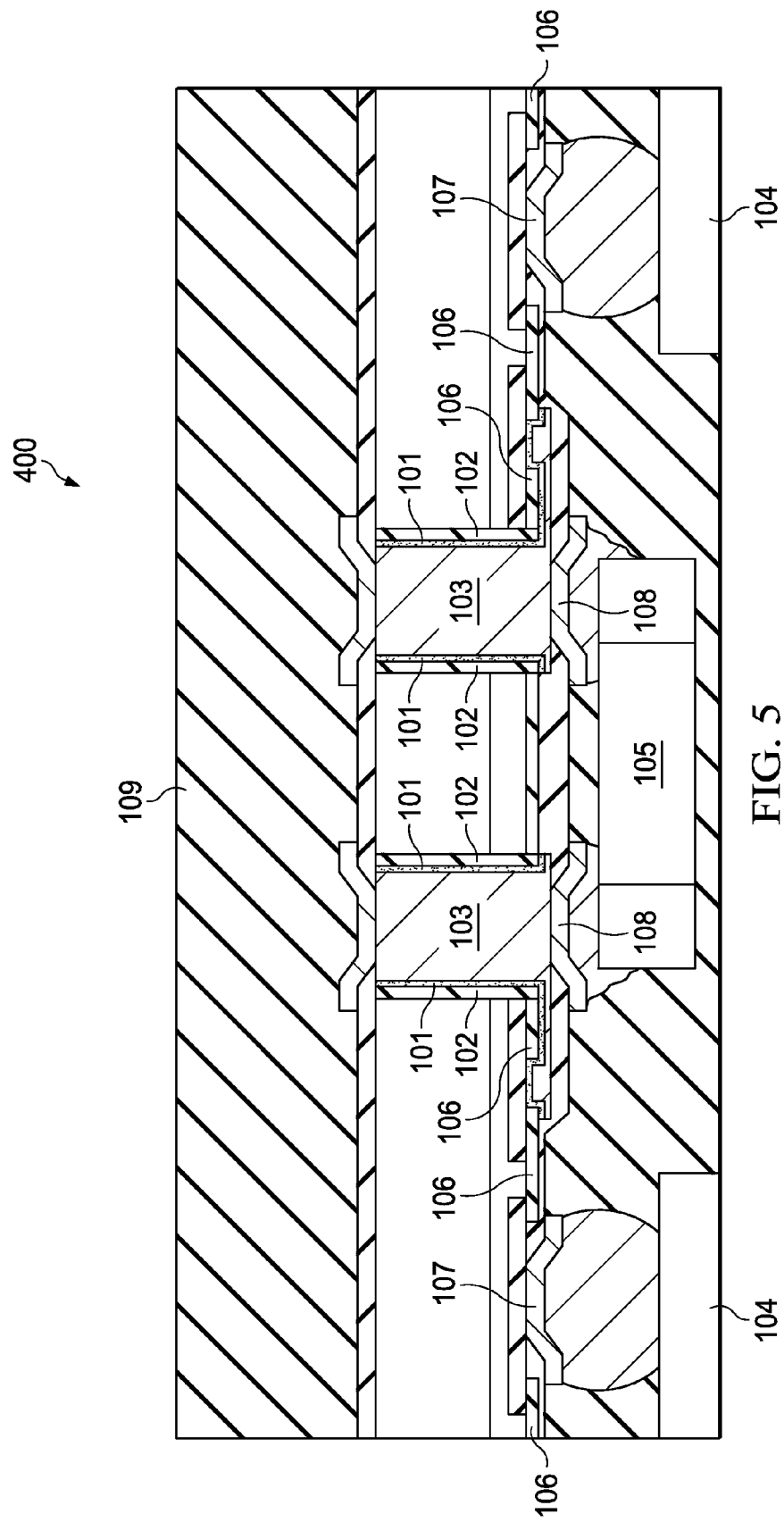
FIG. 5 is a cross sectional view of an exemplary package detailing a flip chip mounted integrated circuit with a passive surface mount device mounted to the top (active side) of the integrated circuit die, according to one embodiment of this invention.

FIG. 5 is a cross sectional view another embodiment of an example flip chip integrated circuit 100 coupled to a lead frame 104 with passive surface mount devices 105 mounted to the top of the integrated circuit in a package 400 including an integrated circuit with at least a pair of through silicon via (TSV)s 103, surface mount passive device 105 coupled to the at least a pair of TSVs 103 and mounted on the top (active side) of the integrated circuit.

The integrated circuit and its passive component is then assembled by soldering the passive component to the integrated circuit and soldering the integrated circuit in flip chip fashion to the lead frame 104. The assembly is then encapsulated in molding compound 109 to protect the assembly from the outside environment while exposing the leads of the leadframe to the outside world for coupling into a more complex system.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings. By way of example, the passive components may be mounted onto the active surfaces of the dice either before or after the wafer has been singulated While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A packaged integrated circuit device, comprising:
   a lead frame, having a plurality of leads;
   an integrated circuit die having an active surface and a back surface;
   the active surface of the integrated circuit die includes a first set of bond pads, multiple metallization layers that overlie active circuits formed within the semiconductor substrate of the die, intermediate dielectric layers interposed between the metallization layers to physically and electrically separate the metallization layers, electrically conductive vias formed in the dielectric layers at appropriate locations in order to electrically connect specific portions of the metallization layers in desired locations;
   at least one pair of through silicon via (TSV)s, the TSVs having a first end and a second end, wherein the first end of the each TSV is coupled to the metal interconnection patterns of the active surface of the integrated circuit die and the second end of the TSV is coplanar with the back surface of the integrated circuit die. Each TSV has solderable under bump metalizations UBM on each end of the TSV;
   at least one surface mount passive device;
   wherein the at least one surface mount passive device is mounted on the top or bottom of the integrated circuit die and coupled to the at least one pair of TSVs;
   the first set of bond pads of the plurality of bond pads are coupled to leads of the lead frame by solder balls; and
   molding compound encapsulating the assembly, wherein the molding compound protects the assembly from the outside environment while exposing the leads of the leadframe to the outside world for coupling into a more complex electrical system.

2. The packaged integrated circuit device of claim 1, wherein TSVs comprises:
   a first end, a second end and a side wall that extend through the die, including an insulator layer on the side walls of the via selected from the group of silicon dioxide, silicon nitride, oxide-nitride-oxide, hafnium oxide or aluminum oxide on the walls of the via;
   an adhesion layer overlaying the insulator layer selected from the group of tantalum-tantalum nitride or titanium-titanium nitride; and finally the via cavity is filled with a conductive material, selected from the group of tungsten or copper.

3. The packaged integrated circuit device of claim 1, wherein the surface mount passive devices are selected from the group of resistors, capacitors or inductors.

4. The packaged integrated circuit device of claim 1, wherein the metalization layers on the integrated circuit die are either aluminum or copper.

5. The packaged integrated circuit device of claim 1, wherein the dielectric layers between the metalization layers on the integrated circuit die are either silicon dioxide or silicon nitride.

6. The packaged integrated circuit device of claim 1, wherein the at least one surface mount passive device is mounted on the top of the integrated circuit die and coupled to the at least one pair of TSVs.

7. The packaged integrated circuit device of claim 1, wherein the at least one surface mount passive device is mounted on the bottom of the integrated circuit die and coupled to the at least one pair of TSVs.

8. The packaged integrated circuit device of claim 1, wherein there are at least two surface mount passive devices, at least one mounted on the bottom of the integrated circuit die and coupled to the at least one pair of TSVs and at least one mounted on the top of the integrated circuit die and coupled to the at least one pair of TSVs.

9. A method of packaging integrated circuit devices, comprising:
- providing a lead frame, having a plurality of leads;
- providing an integrated circuit wafer, the wafer including a multiplicity of integrated circuit dice, each die having an active surface and a back surface, the active surface of each die including a first set of bond pads and a second set of bond pads, the back surfaces of the dice combining to form the back surface of the wafer;
- forming multiple metallization layers that overlie active circuits formed within the semiconductor substrate of the die;
- forming intermediate dielectric layers interposed between the metallization layers to physically and electrically separate the metallization layers;
- forming electrically conductive vias in the dielectric layers at appropriate locations in order to electrically connect specific portions of the metallization layers in desired locations;
- forming at least one pair of through silicon via (TSV)s, the TSVs having a first end and a second end, wherein the first end of the each TSV is coupled to the metal interconnection patterns of the active surface of the integrated circuit die and the second end of the TSV is coplanar with the back surface of the integrated circuit die;
- forming solderable under bump metalizations UBM on each end of the TSV;
- providing at least one surface mount passive device;
- mounting the at least one surface mount passive device on the top or bottom of the integrated circuit die and coupling it to the at least one pair of TSVs;
- coupling the first set of bond pads to each of the plurality of leads of the lead frame using solder balls; and
- encapsulating the assembly with molding compound, wherein the molding compound protects the assembly from the outside environment while exposing the leads of the leadframe to the outside world for coupling into a more complex electrical system.

10. The method of packaging integrated circuit devices of claim 9, wherein TSVs comprises:
- providing a first end, a second end and a side wall that extends through the die, including an insulator layer deposited on the side walls of the via selected from the group of silicon dioxide, silicon nitride, oxide-nitride-oxide, hafnium oxide or aluminum oxide;
- depositing an adhesion layer overlaying the insulator layer selected from the group of tantalum-tantalum nitride or titanium-titanium nitride; and finally the filling the via cavity with a conductive material, selected from the group of tungsten or copper.

11. The method of packaging integrated circuit devices of claim 9, wherein the surface mount passive devices are selected from the group of resistors, capacitors or inductors.

12. The method of packaging integrated circuit devices of claim 9, wherein the metalization layers formed on the integrated circuit die are either aluminum or copper.

13. The method of packaging integrated circuit devices of claim 9, wherein the dielectric layers between the metalization layers formed on the integrated circuit die are either silicon dioxide or silicon nitride.

14. The method of packaging integrated circuit devices of claim 9, wherein the at least one surface mount passive device is mounted on the top of the integrated circuit die and coupled to the at least one pair of TSVs.

15. The method of packaging integrated circuit devices of claim 9, wherein the at least one surface mount passive device is mounted on the bottom of the integrated circuit die and coupled to the at least one pair of TSVs.

16. The method of packaging integrated circuit devices of claim 9, wherein there are at least two surface mount passive devices, at least one mounted on the bottom of the integrated circuit die and coupled to the at least one pair of TSVs and at least one mounted on the top of the integrated circuit die and coupled to the at least one pair of TSVs.

\* \* \* \* \*